(12) United States Patent
Yan

(10) Patent No.: US 10,361,314 B2
(45) Date of Patent: Jul. 23, 2019

(54) VERTICAL THIN FILM TRANSISTOR AND METHOD FOR FABRICATING THE SAME

(71) Applicant: INT TECH CO., LTD., Hsinchu County (TW)

(72) Inventor: Chin-Rung Yan, Hsinchu (TW)

(73) Assignee: INT TECH CO., LTD., Hsinchu County (TW)

( * ) Notice: Subject to any disclaimer, the term of this patent is extended or adjusted under 35 U.S.C. 154(b) by 1 day.

(21) Appl. No.: 15/672,773

(22) Filed: Aug. 9, 2017

(65) Prior Publication Data

US 2018/0047851 A1 Feb. 15, 2018

(30) Foreign Application Priority Data

Aug. 11, 2016 (TW) .............................. 105125618 A

(51) Int. Cl.
  *H01L 29/78* (2006.01)
  *H01L 29/417* (2006.01)
  *H01L 29/786* (2006.01)
  *H01L 29/423* (2006.01)
  *H01L 29/66* (2006.01)

(52) U.S. Cl.
  CPC .. *H01L 29/78642* (2013.01); *H01L 29/41733* (2013.01); *H01L 29/42384* (2013.01); *H01L 29/6675* (2013.01); *H01L 29/66787* (2013.01); *H01L 29/785* (2013.01); *H01L 29/78603* (2013.01); *H01L 29/78696* (2013.01)

(58) Field of Classification Search
  CPC ............................................... H01L 29/78642
  USPC ................................................................ 257/66
  See application file for complete search history.

(56) References Cited

U.S. PATENT DOCUMENTS

| | | | |
|---|---|---|---|
| 5,508,531 A * | 4/1996 | Ha | H01L 29/42392 257/401 |
| 5,567,958 A * | 10/1996 | Orlowski | H01L 27/1108 257/330 |
| 5,925,894 A * | 7/1999 | Yang | H01L 29/78624 257/510 |
| 2006/0218124 A1* | 9/2006 | Williamson | G06F 9/30043 |
| 2012/0235150 A1* | 9/2012 | Isobe | H01L 27/1156 257/60 |
| 2012/0327714 A1* | 12/2012 | Lue | G11C 5/02 365/185.17 |

(Continued)

*Primary Examiner* — Igwe U Anya
(74) *Attorney, Agent, or Firm* — WPAT, P.C., Intellectual Property Attorneys; Anthony King

(57) ABSTRACT

The present invention discloses a vertical thin film transistor and a method for fabricating the same. A vertical current path is formed in a vertical direction of the thin film transistor, thereby increasing the channel length for a given layout area. The design for the pixel circuit plays an important role in managing the compensation process instability. A relatively long channel is usually needed for driving a thin film transistor so as to improve electrical stability of components, regardless of the compensation circuit used. The present invention provides a vertical thin film transistor having a top gate, such that a current path is formed in the Z direction in addition to the current paths in the X-Y direction. Such scheme increases the effective channel length for a given area, thereby reducing the required layout area. Also, the short-channel effect can be reduced for a gate length of 2 μm.

8 Claims, 4 Drawing Sheets

(56) References Cited

U.S. PATENT DOCUMENTS

2016/0020096 A1* 1/2016 Zhang .............. H01L 21/02422
257/66
2016/0079440 A1* 3/2016 Ellinger ............ H01L 29/78696
257/43

* cited by examiner

VERTICAL THIN FILM TRANSISTOR AND METHOD FOR FABRICATING THE SAME

PRIORITY CLAIM AND CROSS-REFERENCE

This application claims priority to TW Patent Application Serial No. 105125618 filed Aug. 11, 2016, the disclosure of which is hereby incorporated by reference in its entirety.

TECHNICAL FIELD

The present invention relates to a thin film transistor, and particularly, to a vertical thin film transistor having a top gate structure with a vertical channel.

BACKGROUND

As display technology evolves, the pixel circuit plays an increasingly important role in managing the instability of the compensation process of the active matrix organic light-emitting diode (AMOLED) display technology. One factor in the instability of the compensation process is the influence of a threshold voltage (Vth) in a compensation device, or of a circuit voltage drop (IR drop). A relatively long channel is needed in designing a driving thin film transistor (TFT) to improve the electrical stability of devices. An S-type or V-type structure with a channel length of more than 40 μm is commonly used to improve the component stability. However, increases to channel length cause the amount of required layout area to increase accordingly.

As the display technology has improved, the number of pixels per unit has increased. Accordingly, minimum device size required to include a given number of pixels is reduced. The above-mentioned channel scheme cannot achieve the reduced minimum device size. When the channel length is reduced to less than 2 μm, a serious short-channel effect occurs.

It is known in the art that to reduce the layout area of a channel, a vertical channel is introduced within a limited layout area to extend the channel length. The short-channel effect can be avoided accordingly. It is disclosed in the art that, by leveraging the characteristics of a bottom-gate TFT device, a profile of a gate electrode can be used as a carrier layer of a channel. Consequently, a relatively long channel with a vertical channel structure is obtained.

In the process of fabricating a low temperature polysilicon (LTPS) TFT, the polysilicon film layer is formed as required from amorphous silicon through laser annealing. As compared with the conventional amorphous silicon TFT, the LTPS TFT approach provides an increased electron mobility, a reduced material cost, an enhanced aperture ratio, a lowered panel weight, and an improved power consumption.

However, the quality of the laser annealing may be reduced due to the bottom-gate TFT structure. As a result, the electron mobility may be affected. Although the bottom-gate TFT structure can accommodate the vertical channel scheme to increase the channel length per unit area, the channel conductivity is adversely affected.

Therefore, it is desirable to eliminate the shortcomings in the above-mentioned conventional approaches. As such, the present invention provides a vertical thin film transistor with a top-gate structure to meet the requirements of both the vertical channel design and the laser annealing process.

BRIEF SUMMARY OF THE INVENTION

An aspect of the present invention provides a vertical thin film transistor. According to an embodiment of the present invention, the vertical thin film transistor of the present invention includes a substrate, a buffer layer, a semiconductor layer, and a gate electrode. The buffer layer is disposed on the substrate and includes a surface. The surface has an aperture, and the buffer layer includes a sidewall and a bottom surface inside the aperture. The semiconductor layer is disposed on the surface of the buffer layer, a vertical channel is formed on the sidewall, and a horizontal channel is formed on the bottom surface. The horizontal channel is electrically connected to the vertical channel. The gate electrode is disposed on the semiconductor layer.

The semiconductor layer includes two doped regions respectively disposed on opposite sides of the semiconductor layer. The gate electrode is disposed between the two doped regions.

The vertical thin film transistor further includes a source electrode and a drain electrode connected to the two doped regions, respectively.

In addition, the vertical thin film transistor further includes a gate insulation layer disposed between the gate electrode and the semiconductor layer.

Another aspect of the present invention provides a method for fabricating a vertical thin film transistor. According to an embodiment of the present invention, the method includes the following steps: ($S_1$) providing a substrate, ($S_2$) forming a buffer layer on the substrate, wherein the buffer layer includes a surface, ($S_3$) forming an aperture on the surface of the buffer layer, wherein the buffer layer includes a sidewall and a bottom surface inside the aperture, ($S_4$) forming a semiconductor layer on the surface of the buffer layer, and forming a vertical channel on the sidewall and a horizontal channel on the bottom surface, wherein the horizontal channel is electrically connected to the vertical channel, and ($S_5$) forming a gate electrode on the semiconductor layer.

The method further includes the step of forming two doped regions on opposite sides of the semiconductor layer, between step S4 and step S5, wherein the gate electrode is formed between the two doped regions.

Further, the step of forming the two doped regions on the opposite sides of the semiconductor layer further includes a step of forming a source electrode and a drain electrode connected to the two doped regions, respectively.

In comparison with the prior art, the vertical thin film transistor of the present invention provides a thin film transistor having a top gate structure with a vertical channel. The number of effective current paths is increased due to a current path generated in the vertical direction. With regard to a driving TFT application for the pixel circuit, e.g., a product having a pixel density of 300 to 500 ppi (pixels per inch), the channel length for a given layout area is increased and the current stability is enhanced. The space can be utilized by other devices, and thus the product yield is increased.

Moreover, as far as a high-resolution (greater than 1,000 ppi) application is concerned, if the channel length is less than 2 μm, a severe short-channel effect may occur. However, the vertical structure of the vertical TFT in the present invention increases the effective channel length. Accordingly, a greater channel length is achieved in practice given a gate length of 2 μm, thereby preventing the short-channel effect.

The advantages and the spirit of the present invention can be further understood by the following detailed description of the invention and the accompanying drawings.

DETAILED DESCRIPTION

The present invention is described in detail with reference to the accompanying drawings that clearly illustrate objectives, technical solution and advantages of the present invention.

Figure 1:
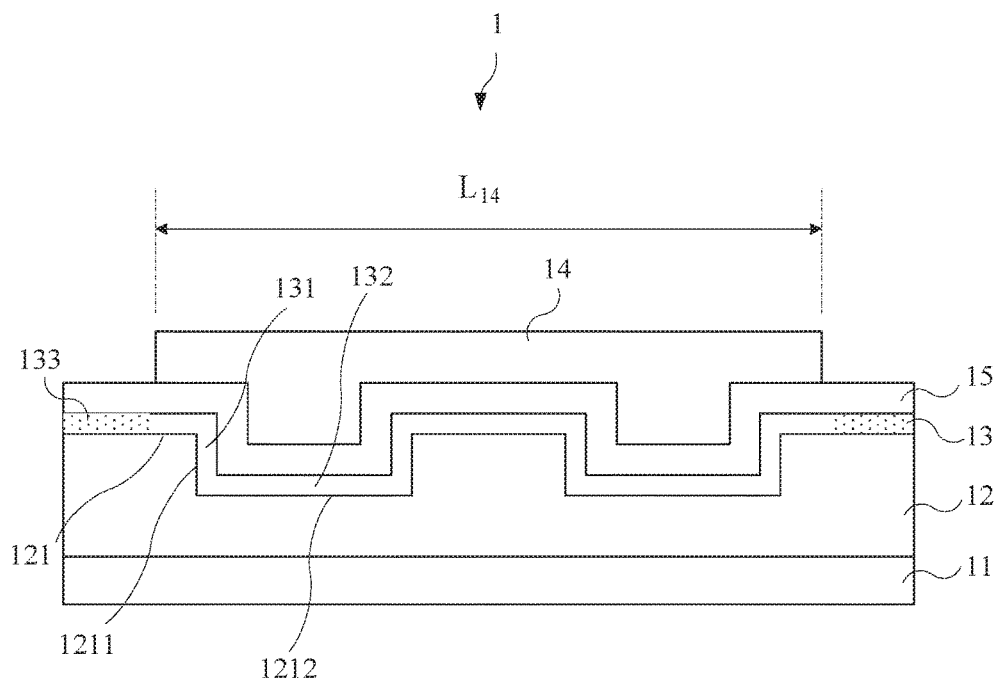
FIG. 1 is a schematic view showing a vertical thin film transistor (VTFT) in accordance with an embodiment of the present invention.

Referring to FIG. 1, a schematic view of a vertical thin film transistor (VTFT) 1 is shown according to an embodiment of the present invention. One aspect of the present invention provides a VTFT 1. According to an embodiment of the present invention, the VTFT 1 of the present invention includes a substrate 11, a buffer layer 12, a semiconductor layer 13 and a gate electrode 14. The buffer layer 12 is disposed on the substrate 11, and the buffer layer 12 includes a surface 121. The surface 121 has an aperture and the buffer layer 12 has a sidewall 1211 in the aperture. The semiconductor layer 13 is disposed on the surface 121 of the buffer layer 12, and a vertical channel 131 is formed on the sidewall 1211. The gate electrode 14 is disposed on the semiconductor layer 13.

A width of the aperture ay be 2 μm, and a depth of the aperture may be 0.6 μm.

Further, the buffer layer 12 has a bottom surface 1212 in the aperture. The semiconductor layer 13 is disposed on the surface 121 of the buffer layer 12, and a horizontal channel 132 is formed on the bottom surface 1212. The horizontal channel 132 is electrically connected to the vertical channel 131.

In addition, a gate length $L_{14}$ of the gate electrode 14 may be 2 μm.

In an embodiment, the horizontal channel 132 may be of an S-type or a V-type.

In an embodiment, the semiconductor layer 13 may be a polysilicon layer. The polysilicon layer is formed from an amorphous silicon layer using an excimer laser annealing process.

Figure 2:
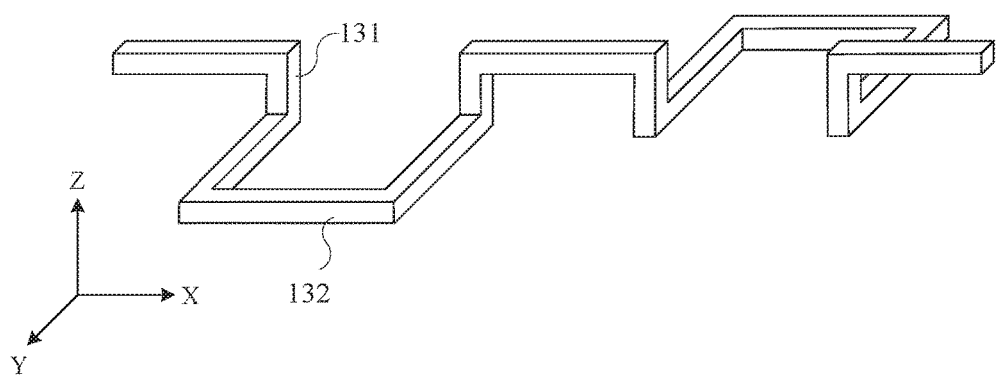
FIG. 2 is a schematic three-dimensional view showing a current path of a vertical thin film transistor according to an embodiment of the present invention.
Figure 3:
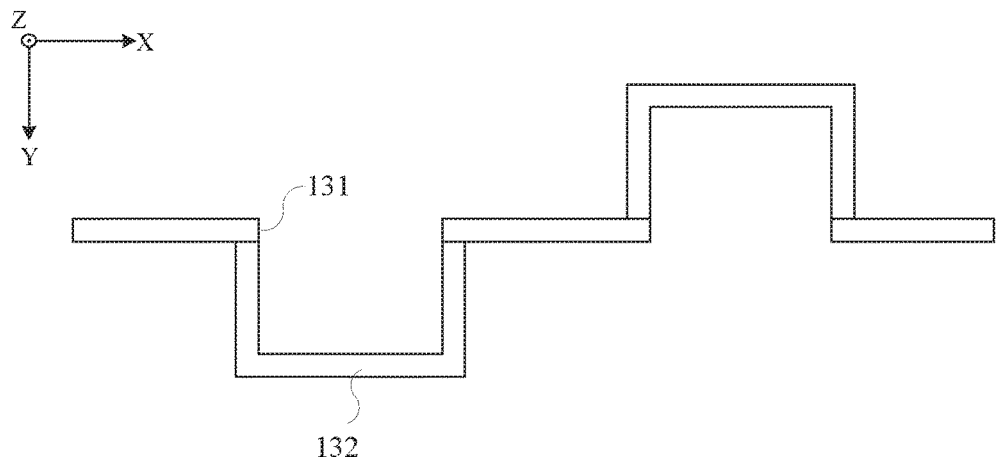
FIG. 3 is a schematic top view showing a current path of a vertical thin film transistor according to an embodiment of the present invention.
Figure 4:
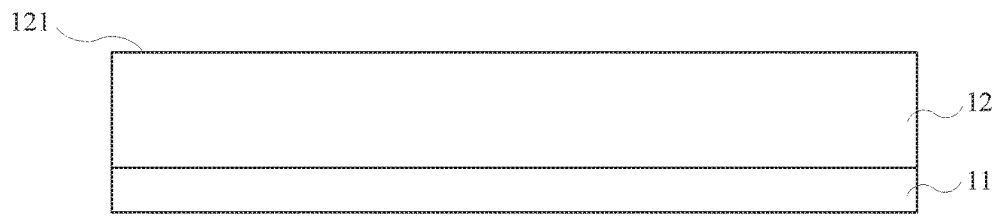
FIGS. 4 through 8 are schematic views showing a processing sequence of a method for fabricating a vertical thin film transistor, in accordance with an embodiment of the present invention.
Figure 5:
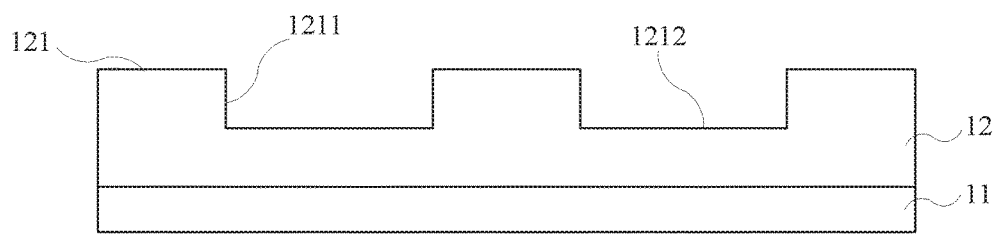
Figure 6:
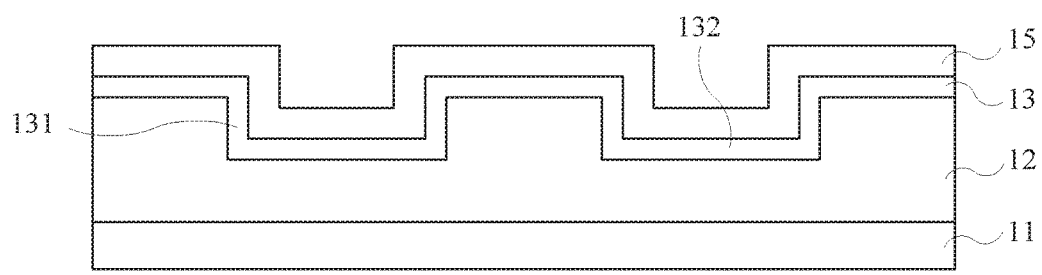
Figure 7:
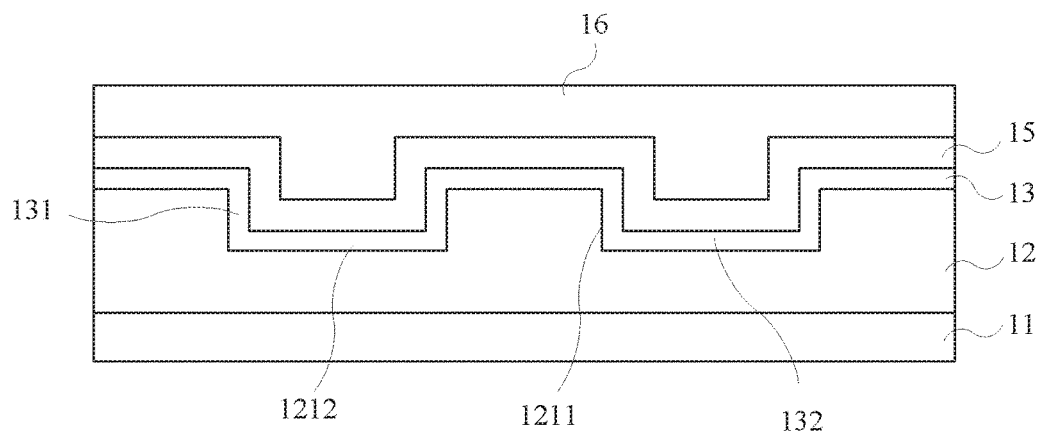
Figure 8:
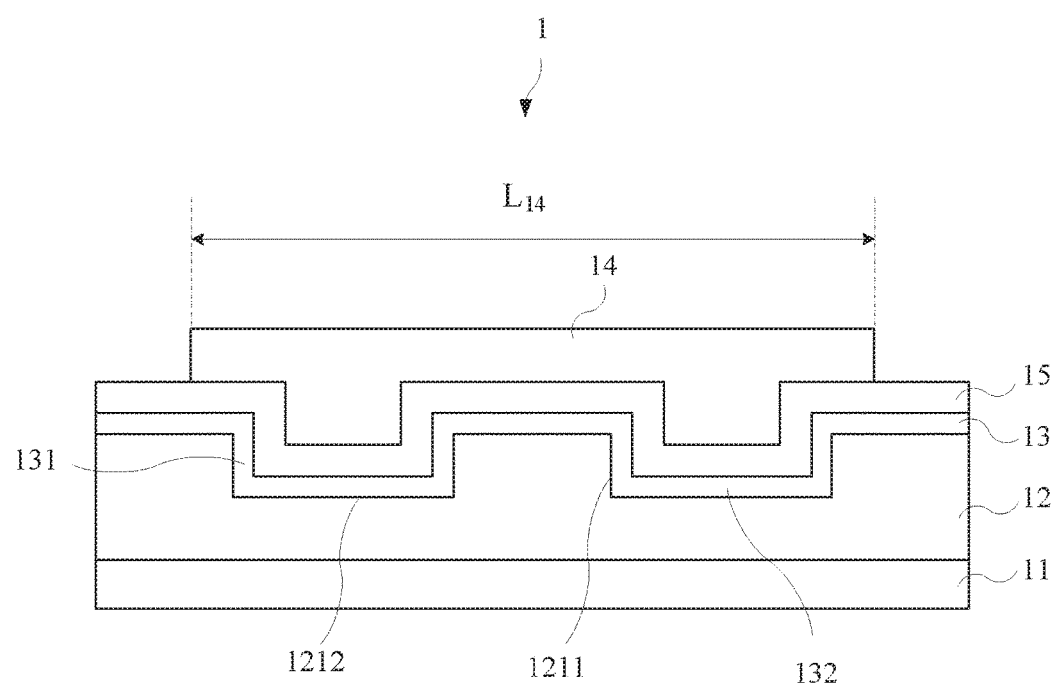

Referring to FIGS. 1 to 3, FIG. 2 is a schematic three-dimensional view showing a current path of the VTFT 1 according to an embodiment of the present invention. FIG. 3 is a schematic top view showing a current path of the VTFT 1 according to an embodiment of the present invention, in an embodiment, a width of the aperture may be 2 μm and a depth of the aperture may be 0.6 μm. Accordingly, the horizontal channel 132 has a length of 2 μm in the X-direction, and the vertical channel 131 has a length of 0.6 μm in the Z-direction. The depicted example shows two apertures. In comparison with the prior art in which the current paths are configured merely in the horizontal direction, the VTFT 1 of the present invention has four vertical channels 131, and thus the channel length is effectively increased to 2.4 μm for a given layout area.

In an embodiment, the VTFT 1 of the present invention further includes a gate insulation layer 15 disposed between the gate electrode 14 and the semiconductor layer 13.

Further, the VTFT 1 of the present invention further includes a source electrode and a drain electrode, each connected to a doped region 133 of the semiconductor layer. The doped region 133 can be an N-type semiconductor or a P-type semiconductor.

FIGS. 4 through 8 are schematic views showing a processing sequence of a method for fabricating the VTFT 1 of the present invention. Another aspect of the present invention provides a method of fabricating the VTFT 1. According to an embodiment of the present invention, the method of fabricating the VTFT 1 of the present invention includes the following steps. In step $S_1$, a substrate 11 is provided. In step $S_2$, a buffer layer 12 is formed on the substrate 11, and the buffer layer 12 has a surface 121. In step $S_3$, one or more apertures are formed on the surface 121 of the buffer layer 12, and the buffer layer 12 has a sidewall 1211 and a bottom surface 1212 in the aperture. In step $S_4$, a semiconductor layer 13 is formed on the surface 121 of the buffer layer 12. A vertical channel 131 is formed on the sidewall 1211, and a horizontal channel 132 is formed on the bottom surface 1212, where the horizontal channel 132 is electrically connected to the vertical channel 131. It is understood that when there are multiple apertures, vertical channels and horizontal channels are formed and interconnected to each other in the semiconductor layer 13. In step $S_5$, a gate electrode 14 is formed on the semiconductor layer 13.

A gate length L14 of the gate electrode 14 may be 2 μm.

Further, a gate electrode layer 16 is deposited during step $S_5$ and is then patterned through etching to form the gate electrode 14.

A material of the gate electrode 14 may be molybdenum.

In addition, the buffer layer 12 is etched during step $S_3$ by an etching process to form the apertures as desired.

The semiconductor layer 13 may be a polysilicon layer. During step $S_4$, the semiconductor layer 13 is formed from an amorphous silicon layer using an excimer laser annealing (ELA) process.

In an embodiment, a width of the aperture may be 2 μm, and a depth of the aperture may be 0.6 μm. Because the performance of the ELA process is not affected by the uneven surface around the aperture, the semiconductor layer 13 as formed can be tightly coupled to the etched aperture.

In some embodiments, between step $S_4$ and step $S_5$, additional steps are performed. Two doped regions are formed respectively on opposite sides of the semiconductor layer 13, and the gate electrode is formed between the two doped regions.

Regarding the step of forming two doped regions on opposite sides of the semiconductor layer, the following steps may be included. A source electrode and a drain electrode are formed and respectively connected to the two doped regions.

Moreover, in an embodiment, step $S_4$ further includes the step $S_{41}$ as follows.

In step $S_{41}$, a gate insulation layer 15 is formed on the semiconductor layer 13.

The gate electrode 14 may be formed on the gate insulation layer 15, such that the gate insulation layer 15 is disposed between the semiconductor layer 13 and the gate electrode 14.

In comparison with prior art, the vertical thin film transistor of the present invention provides a top-gate thin film transistor having a vertical channel. The number of effective current paths is increased due to the current path formed in the vertical direction. In a driving TFT application for the pixel circuit, e.g., a product with 300 to 500 pixels per inch (ppi), the channel length is increased for a given layout area so as to enhance current stability. The space can be utilized by other devices, and thus the product yield is increased.

Moreover, for high-resolution (greater than 1,000 ppi) applications, if the channel length is less than 2 µm, a severe short-channel effect may occur. In contrast, the vertical structure of the vertical thin film transistor of the present invention increases the effective channel length. That way, a greater channel length is achieved in practice given a gate length of 2 µm. The short-channel effect is thus reduced.

The features and scope of the present invention is clearly described, but not limited by, the illustrations of the above embodiments. Furthermore, the various changes and equivalent arrangements are covered by the scope of claims of the present invention.

What is claimed is:

1. A vertical thin film transistor, comprising:
    a substrate;
    a buffer layer disposed on the substrate, wherein the buffer layer comprises a surface having an aperture, and the buffer layer has a sidewall and a bottom surface in the aperture;
    a semiconductor layer disposed on the surface of the buffer layer, the semiconductor layer including a vertical channel on the sidewall and a horizontal channel electrically connected to the vertical channel, wherein the horizontal channel comprises:
        a first portion and a second portion on the bottom surface and extending in different directions; and
        a third portion outside the aperture, wherein the third portion is physically connected to one end of the vertical channel and the first portion is physically connected between the second portion and the other end of the vertical channel; and
    a gate electrode disposed on the semiconductor layer.

2. The vertical thin film transistor of claim 1, wherein semiconductor layer includes two doped regions disposed on opposite sides of the semiconductor layer, and the gate electrode is disposed between the two doped regions.

3. The vertical thin film transistor of claim 2, further comprising a source electrode and a drain electrode connected to the two doped regions, respectively.

4. The vertical thin film transistor of claim 1, further comprising a gate insulation layer disposed between the gate electrode and the semiconductor layer.

5. A method for fabricating a vertical thin film transistor, comprising:
    ($S_1$) providing a substrate;
    ($S_2$) forming a buffer layer on the substrate, wherein the buffer layer has a surface;
    ($S_3$) forming an aperture on the surface of the buffer layer, wherein the buffer layer includes a sidewall and a bottom surface in the aperture;
    ($S_4$) providing an amorphous silicon layer on the surface of the buffer layer and forming a semiconductor layer from the amorphous layer using an excimer laser annealing process, wherein the semiconductor layer comprises a vertical channel on the sidewall and a horizontal channel on the bottom surface, wherein the horizontal channel comprises:
        a first portion and a second portion on the bottom surface and extending in different directions; and
        a third portion outside the aperture, wherein the third portion is physically connected to one end of the vertical channel and the first portion is physically connected between the second portion and the other end of the vertical channel; and
    ($S_5$) forming a gate electrode on the semiconductor layer.

6. The method of claim 5, further comprising forming two doped regions on opposite sides of the semiconductor layer, respectively, between the step $S_4$ and the step $S_5$, wherein the gate electrode is formed between the two doped regions.

7. The method of claim 6, wherein forming the two doped regions on the opposite sides of the semiconductor layer further comprises forming a source electrode and a drain electrode connected to the two doped regions, respectively.

8. The method of claim 5, further comprising forming a gate insulation layer on the semiconductor layer between the step $S_4$ and the step $S_5$, wherein the gate insulation layer is disposed between the semiconductor layer and the gate electrode.

* * * * *